(12) United States Patent
Weng et al.

(10) Patent No.: US 12,360,321 B2
(45) Date of Patent: Jul. 15, 2025

(54) PACKAGE STRUCTURE, SEMICONDUCTOR DEVICE AND METHOD OF FABRICATING THE SAME

(71) Applicant: Taiwan Semiconductor Manufacturing Company, Ltd., Hsinchu (TW)

(72) Inventors: Chung-Ming Weng, Taichung (TW); Hao-Yi Tsai, Hsinchu (TW); Cheng-Chieh Hsieh, Tainan (TW); Hung-Yi Kuo, Taipei (TW); Tsung-Yuan Yu, Taipei (TW); Yu-Hao Chen, HsinChu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 561 days.

(21) Appl. No.: 17/674,778

(22) Filed: Feb. 17, 2022

(65) Prior Publication Data

US 2023/0258881 A1 Aug. 17, 2023

(51) Int. Cl.
*G02B 6/42* (2006.01)
*H01L 23/31* (2006.01)
*H01L 23/498* (2006.01)

(52) U.S. Cl.
CPC ......... *G02B 6/4204* (2013.01); *G02B 6/4251* (2013.01); *H01L 23/3107* (2013.01); *H01L 23/49822* (2013.01)

(58) Field of Classification Search
CPC .............. G02B 6/4204; G02B 6/4251; G02B 6/12002; G02B 6/1228; G02B 6/138; G02B 6/30; G02B 6/4214; G02B 6/43; H01L 23/3107; H01L 23/49822; H01L 24/13; H01L 24/81; H01L 21/76898; H01L 25/105; H01L 2223/6694; H01L 2225/06517; H01L 2225/06524; H01L 2225/06527; H01L 2225/06534; H01L 2225/06548; H01L 2225/06562; H01L 2225/1035; H01L 25/0655; H01L 25/50; H01L 23/3128; H01L 2225/1058; H01L 25/0657

See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |

(Continued)

*Primary Examiner* — Mohammad A Rahman
(74) *Attorney, Agent, or Firm* — JCIPRNET

(57) ABSTRACT

A semiconductor device includes an optical connector element and an optical coupler. The optical connector element includes a base structure, a first polymer via and a cladding layer. The base structure has a first surface and a second surface opposite to the first surface. The first polymer via passes through the base structure from the first surface to the second surface. The cladding layer is surrounding the first polymer via, wherein a refractive index of the cladding layer is different than a refractive index of the first polymer via. The optical coupler is disposed over the optical connector element, wherein the optical coupler receives optical signals from the first polymer via.

20 Claims, 17 Drawing Sheets

(56) References Cited

U.S. PATENT DOCUMENTS

| | | |
|---|---|---|
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2014/0355931 A1* | 12/2014 | Tummala .................. G02B 6/43 |
| | | 264/1.27 |

* cited by examiner

PACKAGE STRUCTURE, SEMICONDUCTOR DEVICE AND METHOD OF FABRICATING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
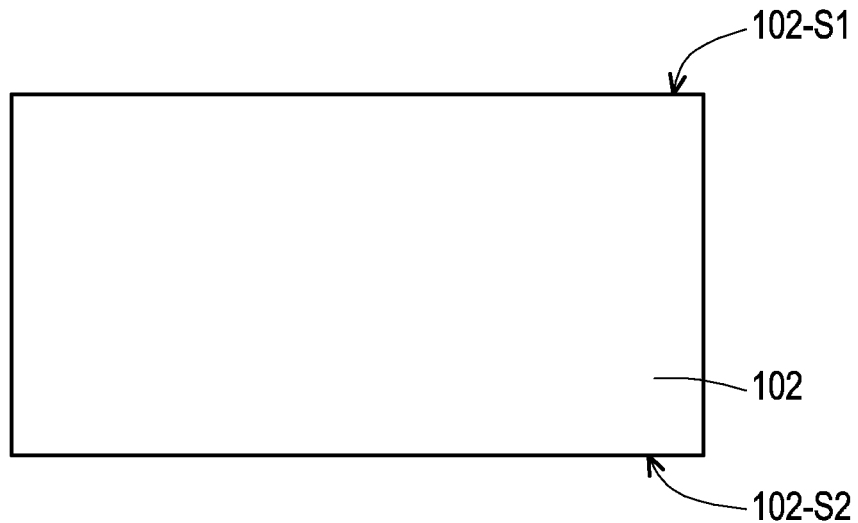
FIG. 1A to FIG. 1F are schematic sectional views of various stages in a method of fabricating an optical connector element in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are schematic sectional views of various stages in a method of fabricating an optical connector element in accordance with some embodiments of the present disclosure. Referring to FIG. 1A, a base structure 102 is provided. For example, the base structure 102 may be or include a bare semiconductor wafer. In some embodiments, the base structure 102 is a silicon wafer. In some other embodiments, the base structure 102 includes other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. The base structure 102 has a first surface 102-S1 and a second surface 102-S2 opposite to the first surface 102-S1.

Figure 1B:
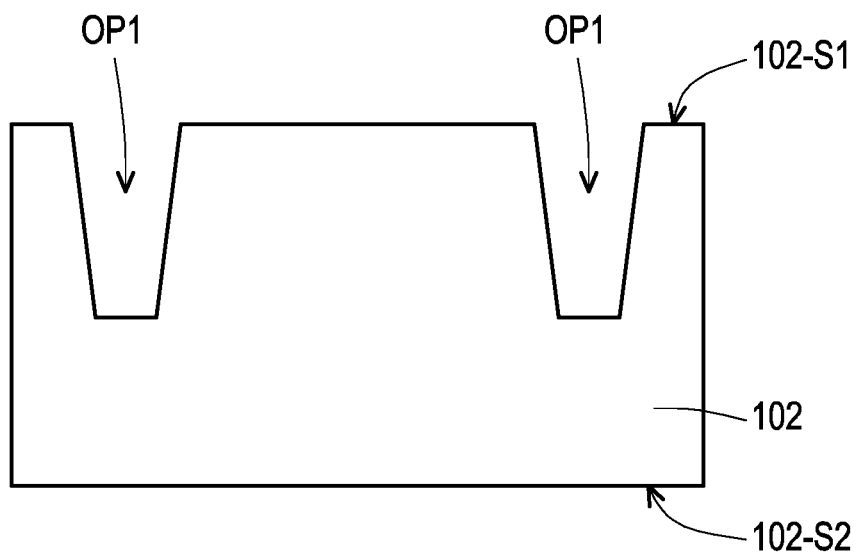

Referring to FIG. 1B, the base structure 102 is etched to form a first opening OP1 and a second opening OP2. For example, the first surface 102-S1 is etched to form the first opening OP1 and the second opening OP2. Although only one first opening OP1 and one second opening OP2 is illustrated herein, it is noted that the disclosure is not limited thereto. In fact, there may be multiple first openings OP1 and second openings OP2 formed in the base structure 102, which may be adjusted based on the number of polymer vias (or optical vias) intended to be formed in subsequent steps.

Figure 1C:
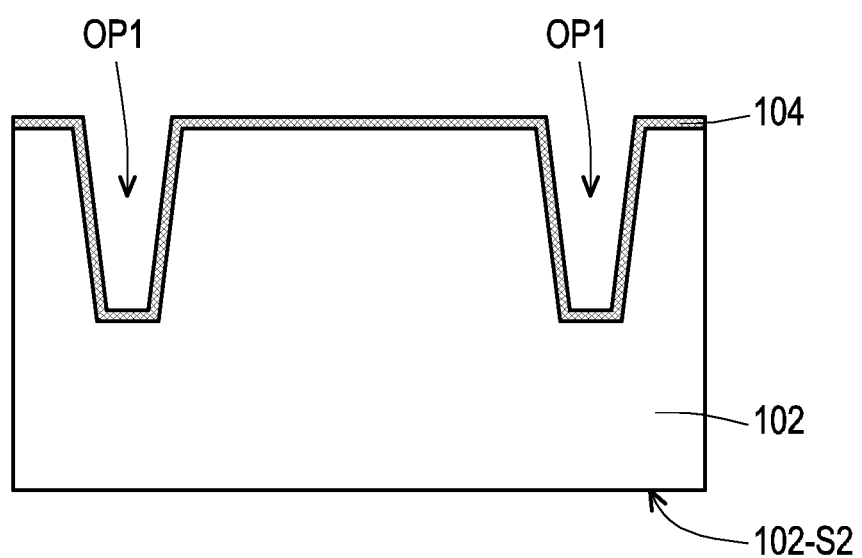

Referring to FIG. 1C, an oxide layer 104 may be deposited on the first surface 102-S1 of the base structure 102 within the first opening OP1 and the second opening OP2. For example, the oxide layer 104 is a silicon oxide layer. In some embodiments, a silicon nitride layer may be optionally deposited on the oxide layer 104 and within the first opening OP1 and the second opening OP2. In some other embodiments, the formation of the oxide layer 104 is omitted.

Figure 1D:
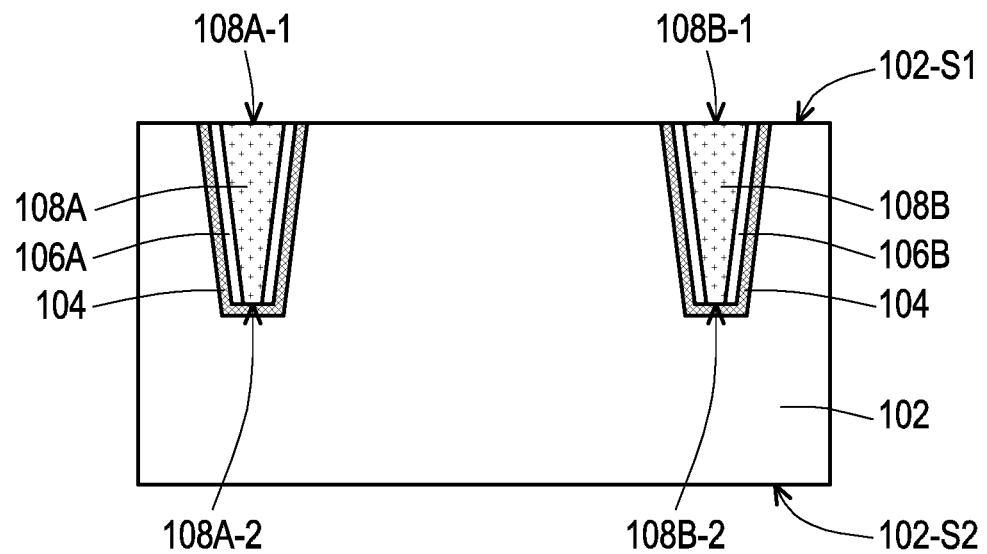

Referring to FIG. 1D, in a subsequent step, a first cladding layer 106A and a first polymer via 108A (first optical via) are formed in the first opening OP1 over the oxide layer 104, while a second cladding layer 106B and a second polymer via 108B (second optical via) are formed in the second opening OP2 over the oxide layer. The first polymer via 108A is surrounded by the first cladding layer 106A, while the first cladding layer 106A is further surrounded by the oxide layer 104. In some embodiments, the first cladding layer 106A extends along sidewalls of the first polymer via 108A from a first end 108A-1 of the first polymer via 108A to a second end 108A-2 of the first polymer via 108A. In a similar way, the second polymer via 108B is surrounded by the second cladding layer 106B, while the second cladding layer 106B is further surrounded by the oxide layer 104. In some embodiments, the second cladding layer 106B extends along sidewalls of the second polymer via 108B from a first end 108B-1 of the second polymer via 108B to a second end 108B-2 of the second polymer via 108B.

In the exemplary embodiment, although the first polymer via 108A and the second polymer via 108B are shown to have widths that decreases from the first ends 108A-1, 108B-1 to the second ends 108A-2, 108B-2, but the disclosure is not limited thereto. For example, in some other embodiments, the first polymer via 108A and the second polymer via 108B have substantially constant widths from the first ends 108A-1, 108B-1 to the second ends 108A-2, 108B-2. In other words, the widths of the first polymer via 108A and the second polymer via 108B are not particularly limited, and may be appropriately adjusted based on design requirement. In some embodiments, the widths (from first end to second end) of the first polymer via 108A and the second polymer via 108B may be in a range of 1 μm to 100 μm, which may be optimized for different optical application.

In some embodiments, the first cladding layer 106A and the second cladding layer 106B are formed by conformally coating a cladding layer (not shown) over the first surface 102-S1 of the base structure 102 in the first opening OP1 and the second opening OP2, and patterning the cladding layer through a lithography process to form the first cladding layer 106A and the second cladding layer 106B. The lithography process may include exposure of the cladding layer, development of the cladding layer, and curing of the exposed and developed material. In some embodiments, the first cladding layer 106A and the second cladding layer 106B are polymeric cladding layers. In certain embodiments, the first polymer via 108A and the second polymer via 108B may be formed in the first opening OP1 and the second opening OP2 through similar methods as with the first cladding layer 106A and the second cladding layer 106B through coating, exposure, development and curing processes.

In some embodiments, the first polymer via 108A (first optical via) and the second polymer via 108B (second optical via) are made of photosensitive materials such as polyimide, polyolefin, polybenzoxazole (PBO), benzocyclobutene (BCB), polynorbornene, acrylate, epoxy, siloxane, a combination thereof, or the like. In certain embodiments, the first cladding layer 106A and the second cladding layer 106B are formed of a polymeric material having a refractive index that is different than a refractive index of the first polymer via 108A and the second polymer via 108B. The first cladding layer 106A and the second cladding layer 106B may be disposed to surround the first polymer via 108A and the second polymer via 108B, such that a leakage of light passing through the first polymer via 108A and the second polymer via 108B may be reduced. The oxide layer 104 is further disposed to surround the first cladding layer 106A and the second cladding layer 106B so that a total reflection of light may be increased.

After forming the first polymer via 108A and the second polymer via 108B, a planarization process may be performed on the first surface 102-S1 of the base structure 102 to reveal the first end 108A-1 of the first polymer via 108A and the first end 108B-1 of the second polymer via 108B. In some embodiments, the planarization process includes a chemical mechanical polishing (CMP) process, a mechanical grinding process, or combinations thereof. After the planarization step, the first end 108A-1 of the first polymer via 108A and the first end 108B-1 of the second polymer via 108B are substantially aligned and coplanar with the first surface 102-S1 of the base structure 102, and are substantially aligned and coplanar with the tops of the first cladding layer 106A, the second cladding layer 106B and the oxide layer 104.

Figure 1E:
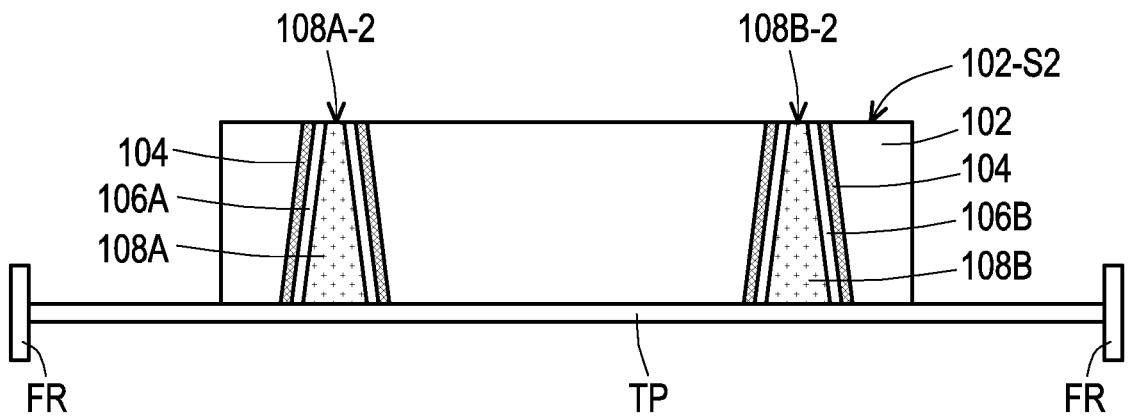
Figure 1F:
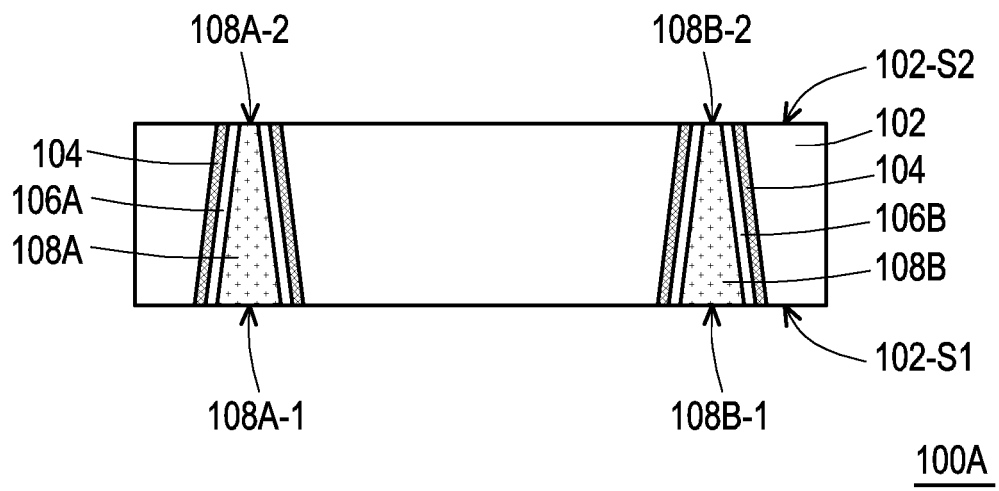

Referring to FIG. 1E, in a subsequent step, the structure shown in FIG. 1D is turned upside down and attached to a tape TP supported by a frame FR. Thereafter, a thickness of the base structure 102 is reduced from the second surface 102-S2 of the base structure 102 to reveal the second end 108A-2 of the first polymer via 108A and the second end 108B-2 of the second polymer via 108B. For example, the thickness of the base structure 102 is reduced by a chemical mechanical polishing (CMP) process, a mechanical grinding process, or combinations thereof. After reducing the thickness of the base structure 102, the second end 108A-2 of the first polymer via 108A and the second end 108B-1 of the second polymer via 108B are substantially aligned and coplanar with the second surface 102-S2 of the base structure 102, and are substantially aligned and coplanar with the tops of the first cladding layer 106A, the second cladding layer 106B and the oxide layer 104. In some embodiments, the base structure 102 (or the wafer) is further sawed to separate the first polymer via 108A and the second polymer via 108B from the other optical vias (not shown). Upon completion of the sawing process, an optical connector element 100A as illustrated in FIG. 1F according to some embodiments of the present disclosure is accomplished.

Figure 2:
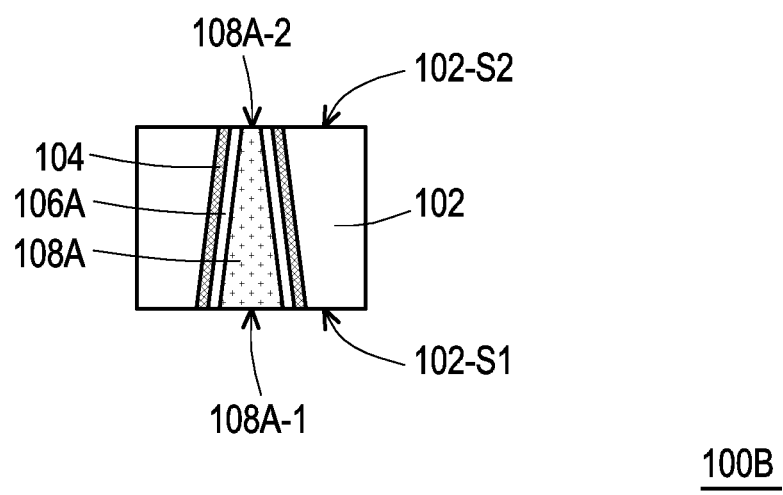
FIG. 2 is a schematic sectional view of an optical connector element in accordance with some embodiments of the present disclosure.

FIG. 2 is a schematic sectional view of an optical connector element in accordance with some embodiments of the present disclosure. The optical connector element 100B shown in FIG. 2 is similar to the optical connector element 100A shown in FIG. 1F. Therefore, the same reference numerals are used to refer to the same or liked parts, and its detailed description will not be repeated herein. The difference between the embodiments is that the second polymer via 108B and the second cladding layer 106B shown in FIG. 1F are omitted from the embodiment of FIG. 2. For example, during the sawing process shown in FIG. 1E, the base structure 102 may be sawed so that selected regions of the base structure 102 are separated out. As illustrated in FIG. 2, in some embodiments, the base structure 102 is sawed so that optical connector element 100B contains one first polymer via 108A embedded in the base structure 102, and with the first cladding layer 106A and the oxide layer 104 surrounding the first polymer via 108A. In some other embodiments, the base structure 102 may be selectively sawed so that one or more of the first polymer via 108A or one or more of the second polymer via 108B, or the combination thereof, are included in one optical connector element.

Figure 3A:
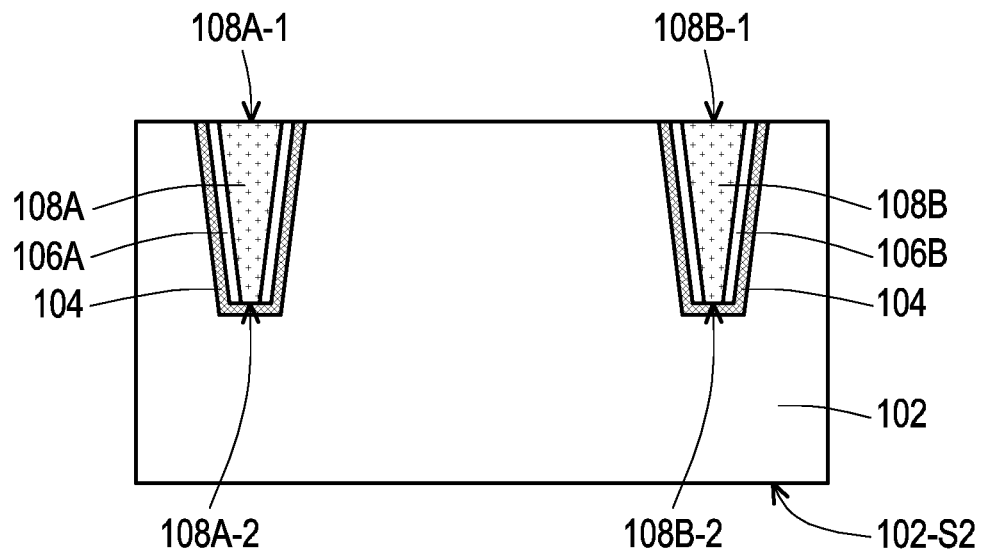
FIG. 3A to FIG. 3E are schematic sectional views of various stages in a method of fabricating an optical connector element in accordance with some other embodiments of the present disclosure.

FIG. 3A to FIG. 3E are schematic sectional views of various stages in a method of fabricating an optical connector element in accordance with some other embodiments of the present disclosure. The method illustrated in FIG. 3A to FIG. 3E is similar to the method illustrated in FIG. 1A to FIG. 1F. Therefore, the same reference numerals are used to refer to the same or liked parts, and its detailed description will not be repeated herein. Referring to FIG. 3A, the same steps described in FIG. 1A to FIG. 1D may be performed to obtain the structure shown in FIG. 3A.

Figure 3B:
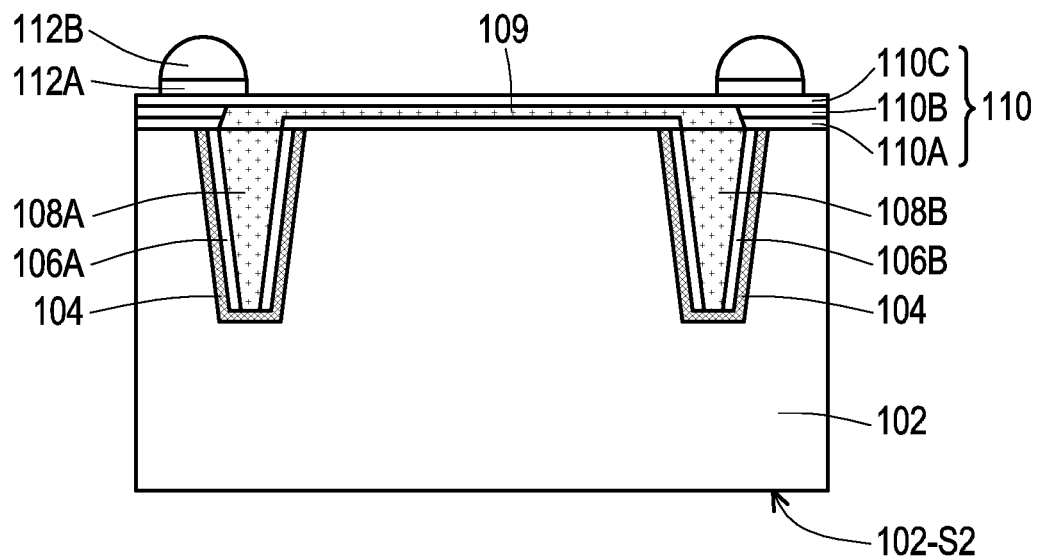

Referring to FIG. 3B, in a subsequent step, a polymer connecting structure 109 is formed over the first surface 102-S1 of the base structure 102 for connecting the first polymer via 108A to the second polymer via 108B. In some embodiments, the polymer connecting structure 109 is surrounded by a polymer material layer 110. In some embodiments, the polymer material layer 110 and the polymer connecting structure 109 are formed by first forming a first polymer layer 110A over the first surface 102-S1 of the base structure 102, and patterning the first polymer layer 110A to reveal the first polymer via 108A and the second polymer via 108B. Thereafter, the polymer connecting structure 109 is formed over the first polymer layer 110A and filled into the openings of the first polymer layer 110A to be connected to the first polymer via 108A and the second polymer via 108B. Finally, a second polymer layer 110B and a third polymer layer 110C may be sequentially formed to cover and surround the polymer connecting structure 109. The first polymer layer 110A, the second polymer layer 110B and the third polymer layer 110C together constitute the polymer material layer 110.

In the exemplary embodiment, a material of the polymer connecting structure 109 is similar to the material of the first polymer via 108A to the second polymer via 108B. Furthermore, a material of the polymer material layer 110 is similar to the material of the first cladding layer 106A and the second cladding layer 106B. In other words, a refractive index of the polymer connecting structure 109 is different than a refractive index of the polymer material layer 110.

Figure 3C:
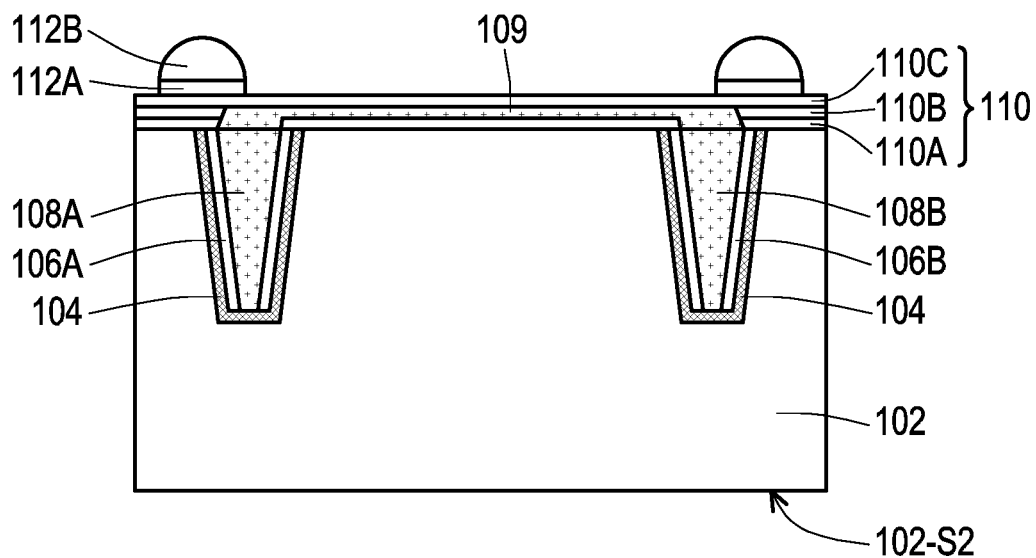

Referring to FIG. 3C, in some embodiments, dummy pads 112A are formed over the polymer material layer 110, while conductive terminals 112B are further formed over the dummy pads 112A. In some embodiments, the conductive terminals 112B are disposed on the dummy pads 112A by a ball placement process or reflow process. The dummy pads 112A may be aluminum pads, copper pads or other suitable metal pads. The conductive terminals 112B are, for example, solder balls, or the like. The conductive terminals 112B are used for bonding the optical connector element to other components, and may be omitted in some other embodiments.

Figure 3D:
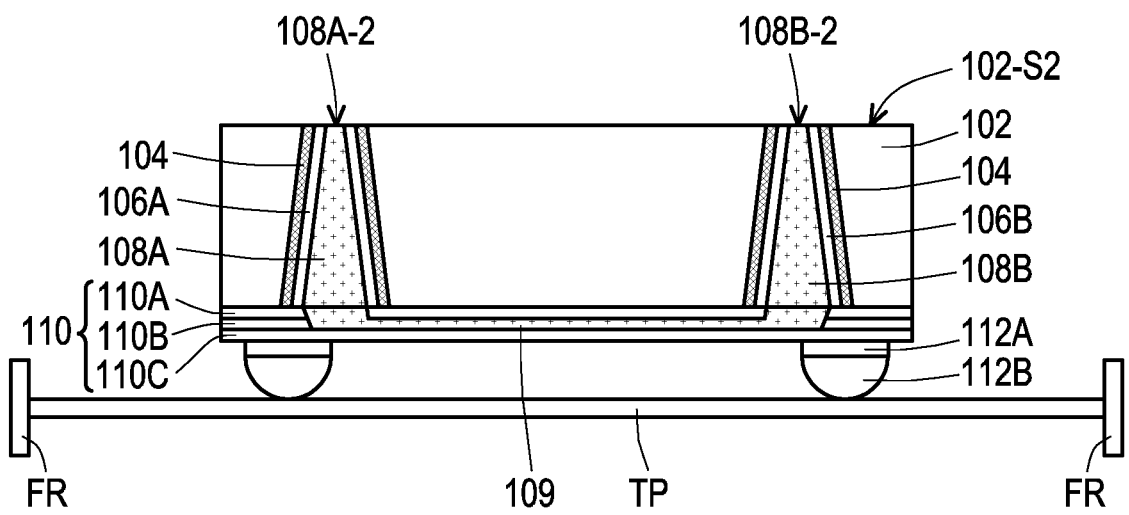

Referring to FIG. 3D, in a subsequent step, the structure shown in FIG. 3C is turned upside down and attached to a tape TP supported by a frame FR. Thereafter, a thickness of the base structure 102 is reduced from the second surface 102-S2 of the base structure 102 to reveal the second end 108A-2 of the first polymer via 108A and the second end 108B-2 of the second polymer via 108B. For example, the thickness of the base structure 102 is reduced by a chemical mechanical polishing (CMP) process, a mechanical grinding process, or combinations thereof.

Figure 3E:
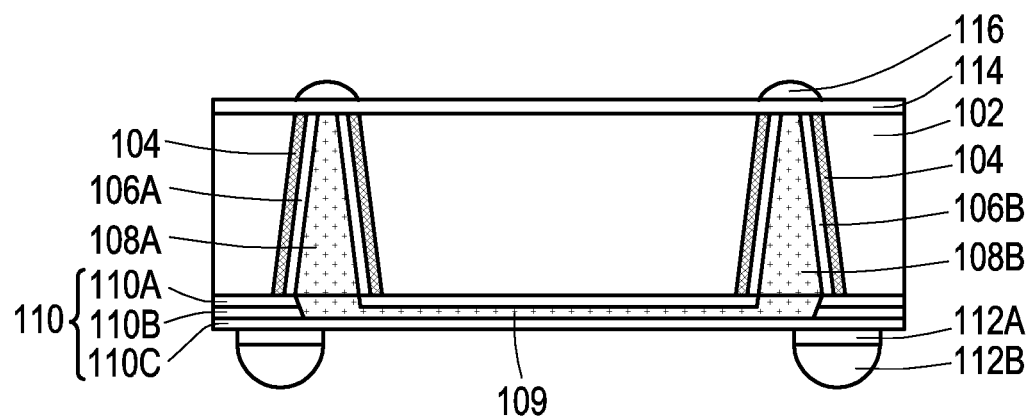

Referring to FIG. 3E, a gradient layer 114 is formed over the second surface 102-S2 of the base structure 102. Furthermore, optical lens 116 are disposed over the gradient layer 114, and are disposed on the first polymer via 108A and the second polymer via 108B. For example, the optical lens 116 are disposed over the second end 108A-2 of the first polymer via 108A, and disposed over the second end 108B-2 of the second polymer via 108B. The optical lens 116 has a flat optical surface and a convex optical surface. The flat optical surface is in contact with the gradient layer 114, while the convex optical surface is facing away from the gradient layer 114. In some embodiments, the gradient layer 114 has a refractive index value that is in between the refractive index of the first/second polymer vias (108A, 108B) and the refractive index of the optical lens 116. In other words, by arranging the gradient layer 114 in between the polymer vias (108A, 108B) and the optical lens 116, there will be gradient change of the refractive index value along the optical transmission path. After forming the gradient layer 114 and disposing the optical lens 116, the base structure 102 (or the wafer), the polymer material layer 110, and the gradient layer 114 are further sawed to separate the first polymer via 108A and the second polymer via 108B from the other optical vias (not shown). Upon completion of the sawing process, an optical connector element 100C according to some embodiments of the present disclosure is accomplished.

Figure 4:
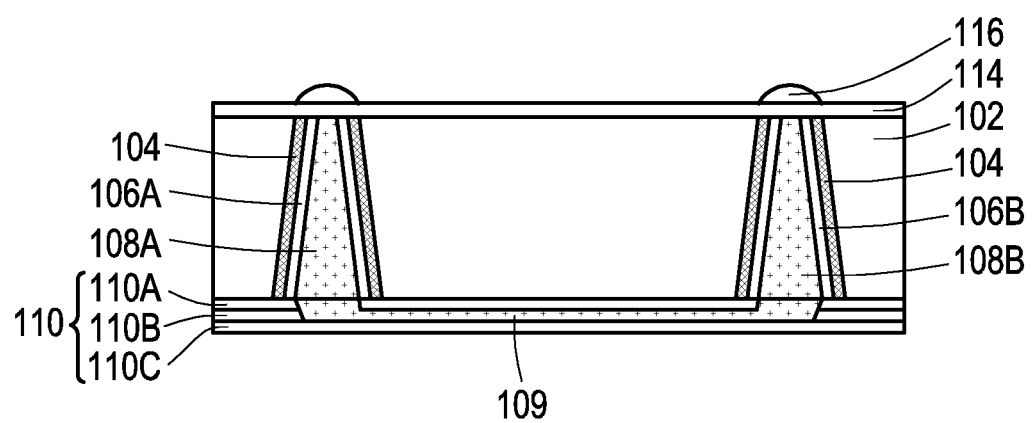
FIG. 4 is a schematic sectional view of an optical connector element in accordance with some other embodiments of the present disclosure.

FIG. 4 is a schematic sectional view of an optical connector element in accordance with some other embodiments of the present disclosure. The optical connector element 100D shown in FIG. 4 is similar to the optical connector element 100C shown in FIG. 3E. Therefore, the same reference numerals are used to refer to the same or liked parts, and its detailed description will not be repeated herein. The difference between the embodiments is that the dummy pads 112A and the conductive terminals 112B are omitted from the optical connector element 100D shown in FIG. 4. In some alternative embodiments, the gradient layer 114 and the optical lens 116 may be further omitted from the optical connector element.

Figure 5A:
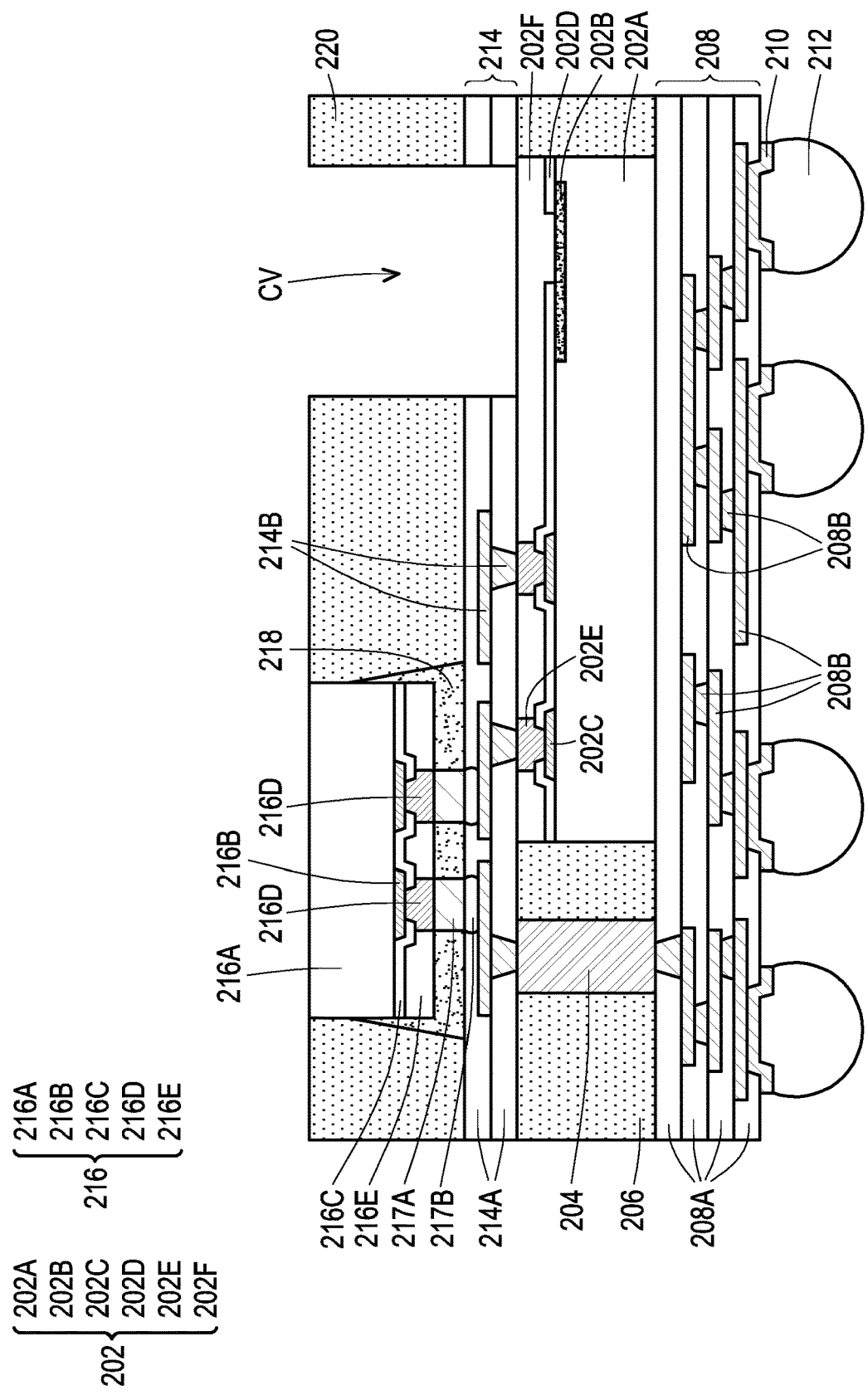
FIG. 5A to FIG. 5B are schematic sectional views of various stages in a method of fabricating a package structure in accordance with some embodiments of the present disclosure.
Figure 5B:
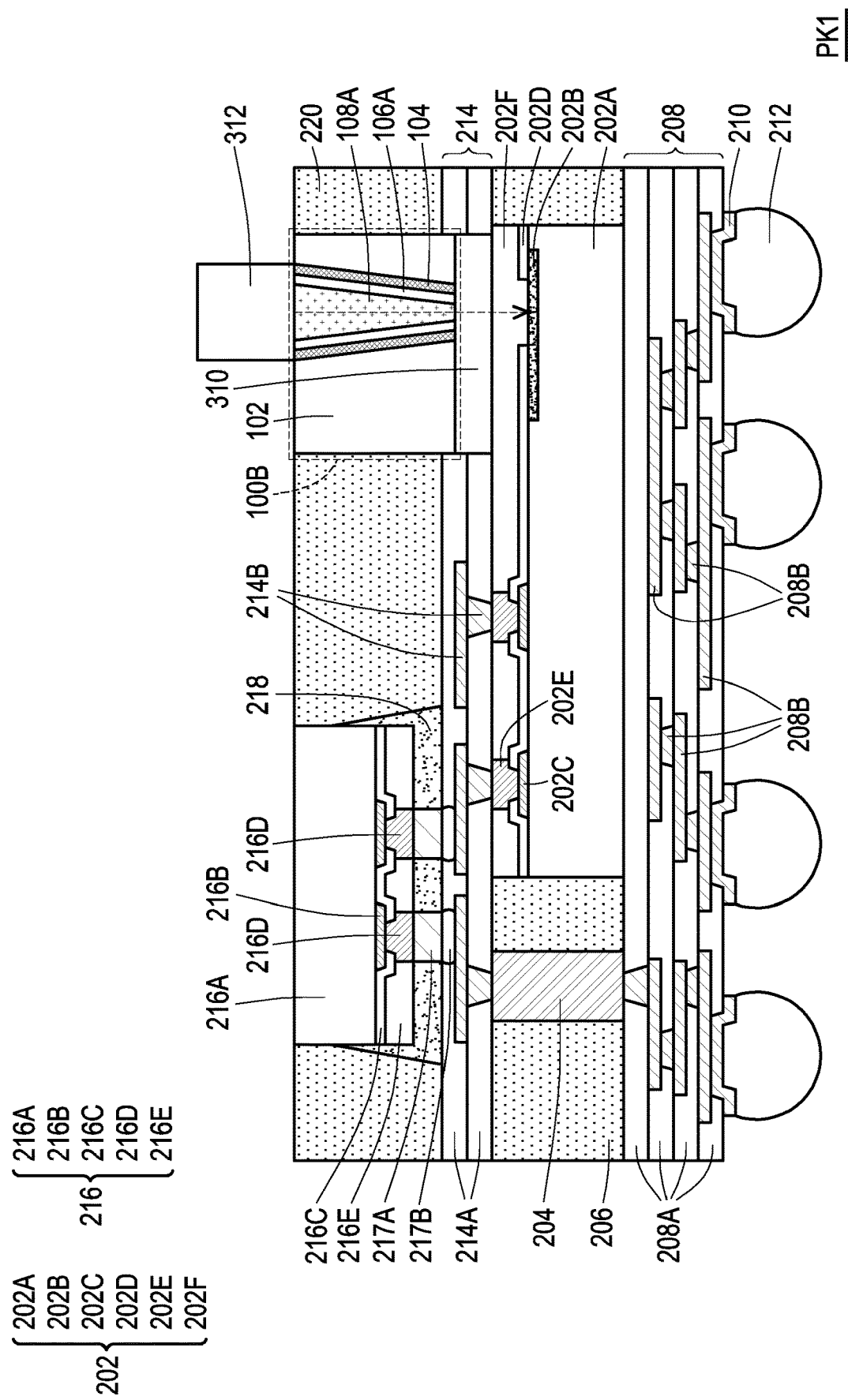

FIG. 5A to FIG. 5B are schematic sectional views of various stages in a method of fabricating a package structure in accordance with some embodiments of the present disclosure. Referring to FIG. 5A, an intermediate stage of fabricating a package structure PK1 (or semiconductor device) is described. As illustrated in FIG. 5A, the package structure PK1 includes a first semiconductor die 202 embedded in an insulating encapsulant 206. The first semiconductor die 202 includes a semiconductor substrate 202A, an optical coupler 202B, a plurality of conductive pads 202C, a passivation layer 202D, a plurality of conductive posts 202E, and a polymer layer 202F.

As shown in FIG. 5A, the optical coupler 202B is disposed on the semiconductor substrate 202, or disposed near top surfaces of the semiconductor substrate 202. The conductive pads 202C are disposed on the semiconductor substrate 202A, and spaced apart from the optical coupler 202B. The passivation layer 202D is formed over the semiconductor substrate 202A and has openings that partially expose the conductive pads 202C on the semiconductor substrate. The passivation layer 202D also include an opening that reveals portion of the optical coupler 202B. In the exemplary embodiment, the semiconductor substrate 202A may be a bulk silicon substrate or a silicon-on-insulator (SOI) substrate, and further includes active components (e.g., transistors or the like) and optionally passive components (e.g., resistors, capacitors, inductors or the like) formed therein.

The optical coupler 202B is a grating coupler, for example. The conductive pads 202C may be aluminum pads, copper pads or other suitable metal pads. The passivation layer 202D may be a silicon oxide layer, a silicon nitride layer, a silicon oxy-nitride layer or a dielectric layer formed of any suitable dielectric materials.

Furthermore, in some embodiments, a post-passivation layer (not shown) is optionally formed over the passivation layer 202D. The post-passivation layer covers the passivation layer 202D and has a plurality of contact openings. The conductive pads 202C are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 202E are formed on the conductive pads 202C by plating. The conductive posts 202E may be made of copper, or the like. In some embodiments, the polymer layer 202F is formed on the passivation layer 202D or on the post passivation layer, and covering the conductive posts 202E so as to protect the conductive posts 202E.

In some embodiments, the first semiconductor die 202 is a photonic die. For example, the first semiconductor die 202 not only transmit and process electrical data, but also transmit and process optical data. The first semiconductor die 202 is embedded in the insulating encapsulant 206. In some embodiments, the insulating encapsulant 206 include polymers (such as epoxy resins, phenolic resins, silicon-containing resins, or other suitable resins), dielectric materials having low permittivity (Dk) and low loss tangent (DO properties, or other suitable materials. In certain embodiments, the insulating encapsulant 206 may further include inorganic filler or inorganic compounds (e.g. silica, clay, and so on) which can be added therein to optimize coefficient of thermal expansion (CTE) of the insulating encapsulant 206. The disclosure is not limited thereto.

As illustrated in FIG. 5A, a backside redistribution layer 208, and a top redistribution layer 214 are respectively formed on two opposing surfaces of the first semiconductor die 202. The backside redistribution layer 208 includes a plurality of dielectric layers 208A and a plurality of conductive elements 208B alternately stacked. Similarly, the top redistribution layer 214 includes a plurality of dielectric layers 214A and a plurality of conductive elements 214B alternately stacked. In the exemplary embodiment, the number of layers of the dielectric layers 208A, 214A and the conductive elements 208B, 214B may be adjusted based on product requirement.

In some embodiments, the material of the dielectric layers 208A, 214A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 208A, 214A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive elements 208B, 214B may be made of conductive materials formed by electroplating or deposition, such as aluminum, titanium, copper, nickel, tungsten, and/or alloys thereof, which may be patterned using a photolithography and etching process. In some embodiments, the conductive elements 208B, 214B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

As illustrated in FIG. 5A, the first semiconductor die 202 is disposed on the backside redistribution layer 208, and being electrically connected to the top redistribution layer 214. For example, the conductive elements 214B of the redistribution layer 214 are electrically connected to the conductive posts 202E of the first semiconductor die 202. In some embodiments, the backside redistribution layer 208 is electrically connected to the top redistribution layer 214 by one or more through vias 204 (only one is shown). For example, the through vias 204 are embedded in the insulating encapsulant 206, and include a metallic material such as copper or copper alloys, or the like.

In some embodiments, a plurality of conductive pads 210 may be disposed on an exposed top surface of the topmost layer of the conductive elements 208B of the backside redistribution layer 208. In certain embodiments, the conductive pads 210 are for example, under-ball metallurgy (UBM) patterns used for ball mount. In some embodiments, the materials of the conductive pads 210 may include copper, nickel, titanium, tungsten, or alloys thereof or the like, and may be formed by an electroplating process, for example. The number of conductive pads 210 are not limited in this disclosure, and may be selected based on the design layout.

In some embodiments, a plurality of conducive terminals 212 is disposed on the conductive pads 210 and over the backside redistribution layer 208. In some embodiments, the conductive terminals 212 may be disposed on the conductive pads 210 by a ball placement process or reflow process. In some embodiments, the conductive terminals 212 are, for example, solder balls or ball grid array (BGA) balls. In some embodiments, the conductive terminals 212 are connected to the backside redistribution layer 208 through the conductive pads 210. In certain embodiments, some of the conductive terminals 212 may be electrically connected to the first semiconductor die 202 through the backside redistribution layer 208 and the top redistribution layer 214. The number of the conductive terminals 212 is not limited to the disclosure, and may be designated and selected based on the number of the conductive pads 210.

As further illustrated in FIG. 5A, a second semiconductor die 216 is disposed on and electrically connected to the top redistribution layer 214. In some embodiments, the second semiconductor die 216 is disposed on the top redistribution layer 214 through a flip-chip bonding process. For example, the second semiconductor die 216 is electrically connected to the conductive elements 214B of the top redistribution layer 214 through a plurality of conductive posts 217A and conductive bumps 217B. In certain embodiments, the second semiconductor die 216 includes a semiconductor substrate 216A, a plurality of conductive pads 216B, a passivation layer 216C, a plurality of conductive pillars 216D, and a protection layer 216E.

In some embodiments, the plurality of conductive pads 216B is disposed on the semiconductor substrate 216A. The passivation layer 216C is formed over the semiconductor substrate 216A and has openings that partially expose the conductive pads 216B on the semiconductor substrate 216A. The semiconductor substrate 216A may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 216B may be aluminum pads, copper pads or other suitable metal pads. The passivation layer 216C may be a silicon oxide layer, a silicon nitride layer, a silicon oxynitride layer or a dielectric layer formed of any suitable dielectric materials.

Furthermore, in some embodiments, a post-passivation layer (not shown) is optionally formed over the passivation layer 216C. The post-passivation layer covers the passivation layer 216C and has a plurality of contact openings. The conductive pads 216B are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive pillars 216D are formed on the conductive pads 216B by plating. The conductive pillars 216D may be made of a first material, for example, the first material may be copper, or the like. In some embodiments, the protection layer 216E is formed on the passivation layer 216C or on the post passivation layer, and covering the conductive pillars 216D so as to protect the conductive pillars 216D.

In some embodiments, the second semiconductor die 216 is an electronic die that transmit and process electrical data. The second semiconductor die 216 is stacked over the first semiconductor die 202, and is electrically connected to the first semiconductor die 202 through the conductive posts 217A, conductive bumps 217B and the top redistribution layer 214. Furthermore, an underfill structure 218 is formed between the second semiconductor die 216 and the top redistribution layer 214 and fill up the gaps therebetween. In some embodiments, the underfill structure 218 laterally encapsulate the conductive posts 217A. The underfill structure 218 may be applied in liquid or semi-liquid form and then subsequently cured.

As further illustrated in FIG. 5A, an insulating encapsulant 220 is formed to encapsulate the second semiconductor die 216 and the underfill structure 218. For example, the insulating encapsulant 220 includes polymers (such as epoxy resins, phenolic resins, silicon-containing resins, or other suitable resins), dielectric materials having low permittivity (Dk) and low loss tangent (DO properties, or other suitable materials. In an alternative embodiment, the insulating encapsulant 220 may include an acceptable insulating encapsulation material. In some embodiments, the insulating encapsulant 220 may further include inorganic filler or inorganic compound (e.g. silica, clay, and so on) which can be added therein to optimize coefficient of thermal expansion (CTE) of the insulating encapsulant 220. In certain embodiments, the insulating encapsulant 220 may be the same or different than the insulating encapsulant 206. The disclosure is not limited thereto.

In some embodiments, the insulating encapsulant 220 and backsides (e.g. the semiconductor substrate 216A) of the second semiconductor die 216 may be partially ground or polished by a mechanical grinding process and/or a chemical mechanical polishing (CMP) process so that planar surfaces may be obtained. In certain embodiments, portions of the insulating encapsulant 220 and portions of the top redistribution layer may be removed to form a cavity CV. For example, the cavity CV exposes a region of the first semiconductor die 202 that overlaps with the optical coupler 202B. The cavity CV may be used for accommodating an optical connector element.

Referring to FIG. 5B, the optical connector element 100B described in FIG. 2 may be placed into the cavity CV and adhered to the first semiconductor die 202 through an optical gel 310 or adhesive. As shown in FIG. 5B, the optical connector element 100B is encapsulated by the insulating encapsulant 220. The optical connector element 100B includes a first polymer via 108A (first optical via), whereby the first polymer via 108A has a first end 108A-1 and a second end 108A-2 (see FIG. 2). The second end 108A-2 is facing the optical coupler 202B of the first semiconductor die 202, and an optical fiber 312 is attached to the first end 108A-1 of the first polymer via 108A. The optical fiber 312 is an optical input that transmits optical data/optical signal through the first polymer via 108A to the optical coupler 202B (as indicated by the arrow). Up to here, a package structure PK1 (or semiconductor device) in accordance with some embodiments of the present disclosure is accomplished.

Figure 6:
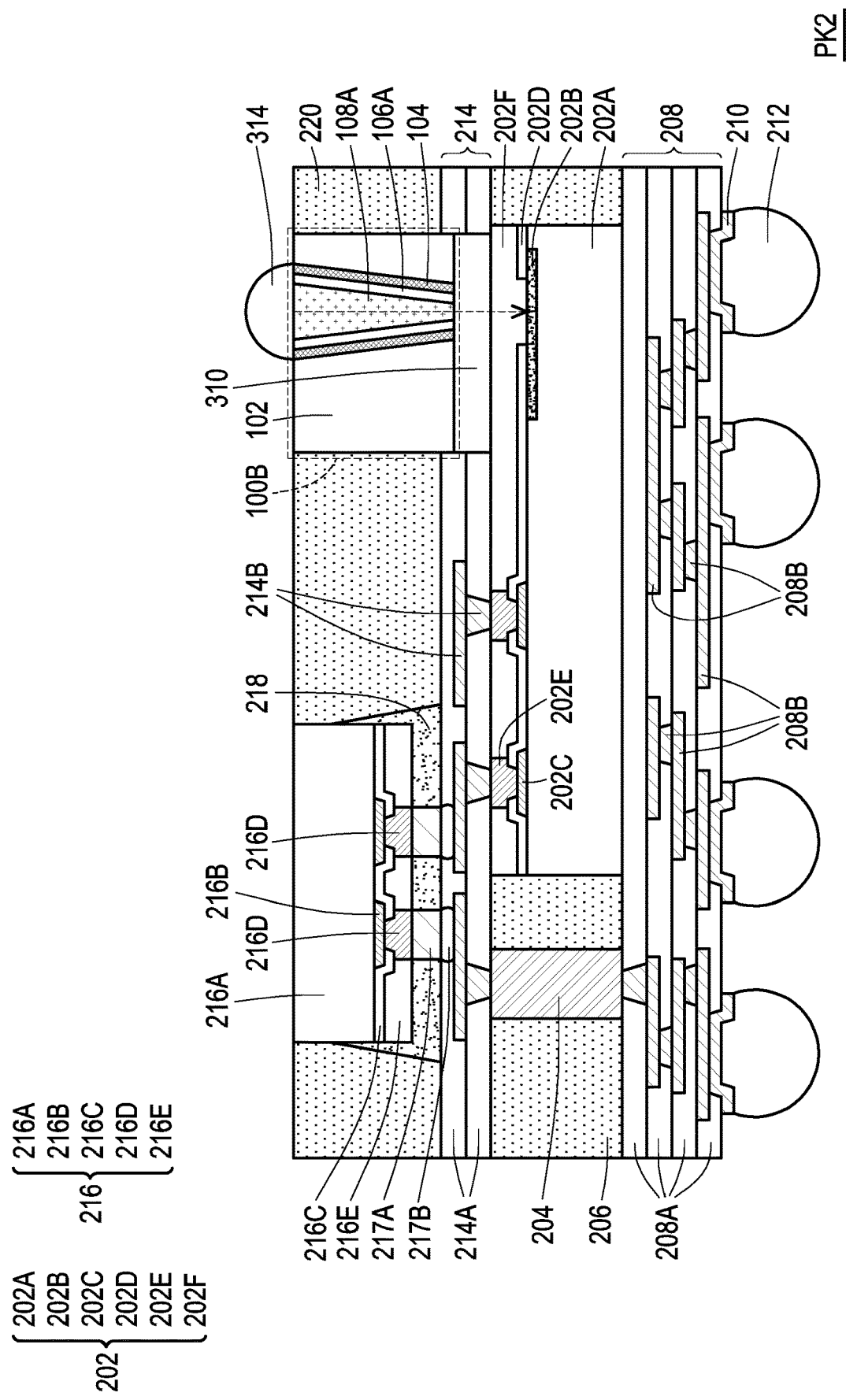
FIG. 6 is a schematic sectional view of a package structure in accordance with some embodiments of the present disclosure.

FIG. 6 is a schematic sectional view of a package structure in accordance with some embodiments of the present disclosure. The package structure PK2 (or semiconductor device) illustrated in FIG. 6 is similar to the package structure PK1 illustrated in FIG. 5B. Therefore, the same reference numerals are used to refer to the same or liked parts, and its detailed description will not be repeated herein. The difference between the embodiments is that the optical fiber 312 shown in FIG. 5B is replaced with an optical lens 314 shown in FIG. 6. As illustrated in FIG. 6, the optical lens 314 is disposed over the first end 108A-1 of the first polymer via 108A. In some embodiments, the optical lens 314 may receive optical data/optical signal from an external optical source, and transmit the optical data/optical signal through the first polymer via 108A to the optical coupler 202B. For example, the external optical source may be light emitting diodes (LEDs), or the like.

Figure 7:
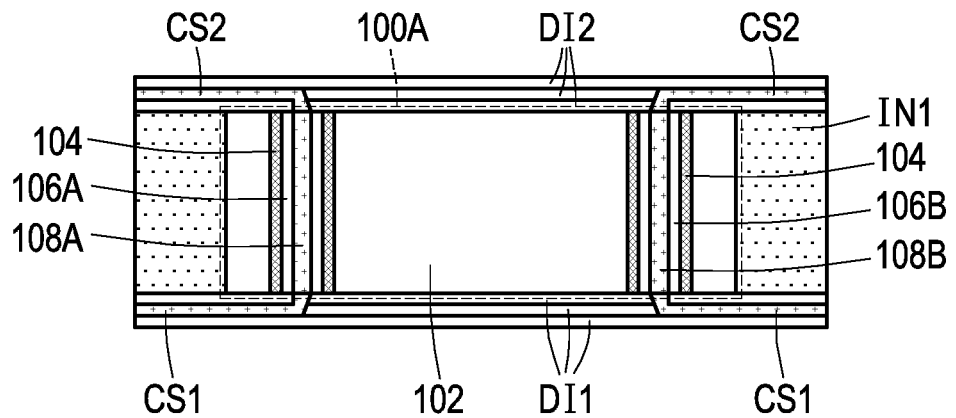
FIG. 7 is a partial sectional view of a package structure in accordance with some embodiments of the present disclosure.

FIG. 7 is a partial sectional view of a package structure in accordance with some embodiments of the present disclosure. In the previous embodiments, the optical connector element 100B is embedded in the package structure for transmitting optical data/optical signal in a vertical manner (e.g. from top to bottom, or from bottom to top). However, the disclosure is not limited thereto. For example, as illustrated in FIG. 7, when an optical connector element 100A described in FIG. 1F is included in a package structure, the optical connector element 100A may be used to "fan-out" optical signals to regions non-overlapped with the optical connector element 100A. The details of the optical connector element 100A can be referred to FIG. 1A to FIG. 1F and will not be repeated herein.

As shown in FIG. 7, in some embodiments, the optical connector element 100A is embedded in an insulating encapsulant IN1 of a package structure. The insulating encapsulant IN1 is similar to the insulating encapsulant 206 or the insulating encapsulant 220 described in FIG. 5A, thus its details will not be repeated herein. In some embodiments, the optical connector element 100A includes a first polymer via 108A and a second polymer via 108B having constant widths. In certain embodiments, a first connecting structure CS1 is connected to one end of the first polymer via 108A, while a second connecting structure CS2 is connected to another end of the first polymer via 108A. In a similar way, another first connecting structure CS1 is connected to one end of the second polymer via 108B, while another second connecting structure CS2 is connected to another end of the second polymer via 108A. The first connecting structure CS1 and the second connecting structure CS2 may be further connected to optical fibers or other optical inputs/devices.

In the exemplary embodiment, the first connecting structures CS1 and the second connecting structures CS2 are used for transmitting optical data/optical signals to the first polymer via 108A and the second polymer via 108B, and for transmitting the optical data/optical signals away from the first polymer via 108A and the second polymer via 108B. In some embodiments, the first connecting structures CS1 are embedded in the dielectric layers DI1, while the second connecting structures CS2 are embedded in the dielectric layers DI2. A material of the first connecting structures CS1 and the second connecting structures CS2 is similar to a material of the polymer connecting structure 109 shown in FIG. 3E. Furthermore, a material of the dielectric layers DU and the dielectric layers DI2 is similar to a material of the polymer material layer 110 shown in FIG. 3E. By using the optical connector element 100A along with the first connecting structures CS1 and the second connecting structures CS2, optical data/optical signals may be transmitted to desired regions of the package structure.

Figure 8:
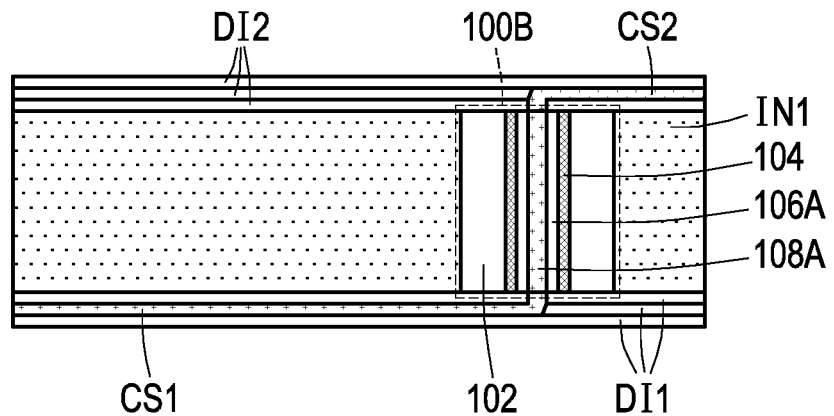
FIG. 8 is a partial sectional view of a package structure in accordance with some other embodiments of the present disclosure.

FIG. 8 is a partial sectional view of a package structure in accordance with some other embodiments of the present disclosure. As illustrated in FIG. 8, similar to the embodiment of FIG. 7 above, when an optical connector element 100B described in FIG. 2 is included in a package structure, the optical connector element 100B may be used to "fan-out" optical signals to regions non-overlapped with the optical connector element 100B. The details of the optical connector element 100A can be referred to FIG. 2 and will not be repeated herein.

As illustrated in FIG. 8, the optical connector element 100B is embedded in an insulating encapsulant IN1 of a package structure. The insulating encapsulant IN1 is similar to the insulating encapsulant 206 or the insulating encapsulant 220 described in FIG. 5A, thus its details will not be repeated herein. In some embodiments, the optical connector element 100B includes a first polymer via 108A having constant width. In certain embodiments, a first connecting structure CS1 is connected to one end of the first polymer via 108A, while a second connecting structure CS2 is connected to another end of the first polymer via 108A. In some embodiments, the first connecting structure CS1 is extending in a first direction away from the first polymer via 108A, while the second connecting structures CS2 is extending in another direction opposite to the first direction away from the first polymer via 108A. The first connecting structure CS1 and the second connecting structure CS2 may be further connected to optical fibers or other optical inputs/devices. By using the optical connector element 100B along with the first connecting structures CS1 and the second connecting structures CS2, optical data/optical signals may be transmitted to desired regions of the package structure.

Figure 9:
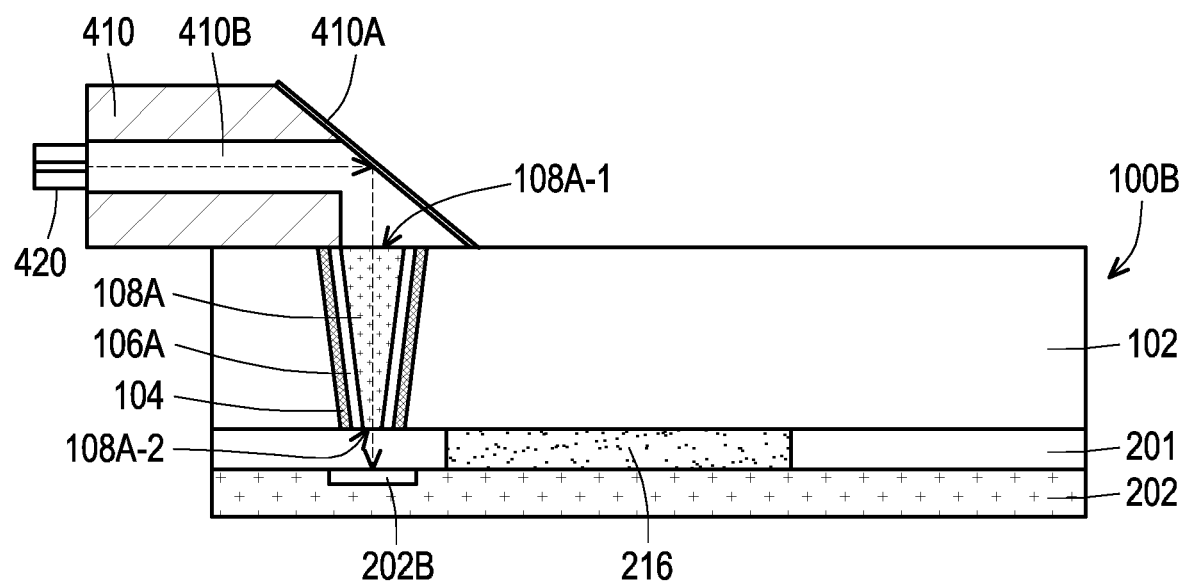
FIG. 9 is a schematic sectional view of a package structure in accordance with some other embodiments of the present disclosure.

FIG. 9 is a schematic sectional view of a package structure in accordance with some other embodiments of the present disclosure. The package structure PK3 (or semiconductor device) illustrated in FIG. 9 may be similar to the package structure PK1 illustrated in FIG. 5B. Therefore, the same reference numerals are used to refer to the same or liked parts, and its detailed description will not be repeated herein. As illustrated in FIG. 9, in the package structure PK3, a second semiconductor die 216 may be stacked on a first semiconductor die 202, whereby the first semiconductor die 202 and the second semiconductor die 216 are similar to that described in FIG. 5B. In other words, the first semiconductor die 202 may be a photonic die including a optical coupler 202B, while the second semiconductor die 216 is an electronic die stacked on the photonic die.

As illustrated in FIG. 9, a polymer layer 201 may be disposed on the first semiconductor die 202 to surround the second semiconductor die 216. Furthermore, the optical connector element 100B described in FIG. 2 may be further disposed over the first semiconductor die 202 and the second semiconductor die 216. For example, the first polymer via 108A of the optical connector element 100B is arranged so that it is aligned with the optical coupler 202B of the first semiconductor die 202. In some embodiments, a prism structure 410 is attached to the first end 108A-1 of the first polymer via 108A, while the second end 108A-2 of the first polymer via 108A is facing the optical coupler 202B. The prism structure 410 has a trimmed interface with a reflective material layer 410A disposed thereon, and a light guide path 410B for guiding light from an optical fiber 420 towards the reflective material layer 410A, and towards the first polymer via 108A. In some embodiments, the reflective material layer 108 includes a metallic layer such as a titanium (Ti) layer, a copper (Cu) layer, a Ti/Cu layer, a silver (Ag) layer, or a gold (Au) layer, and the metallic layer may be formed through a sputtering process, or the like.

Figure 10A:
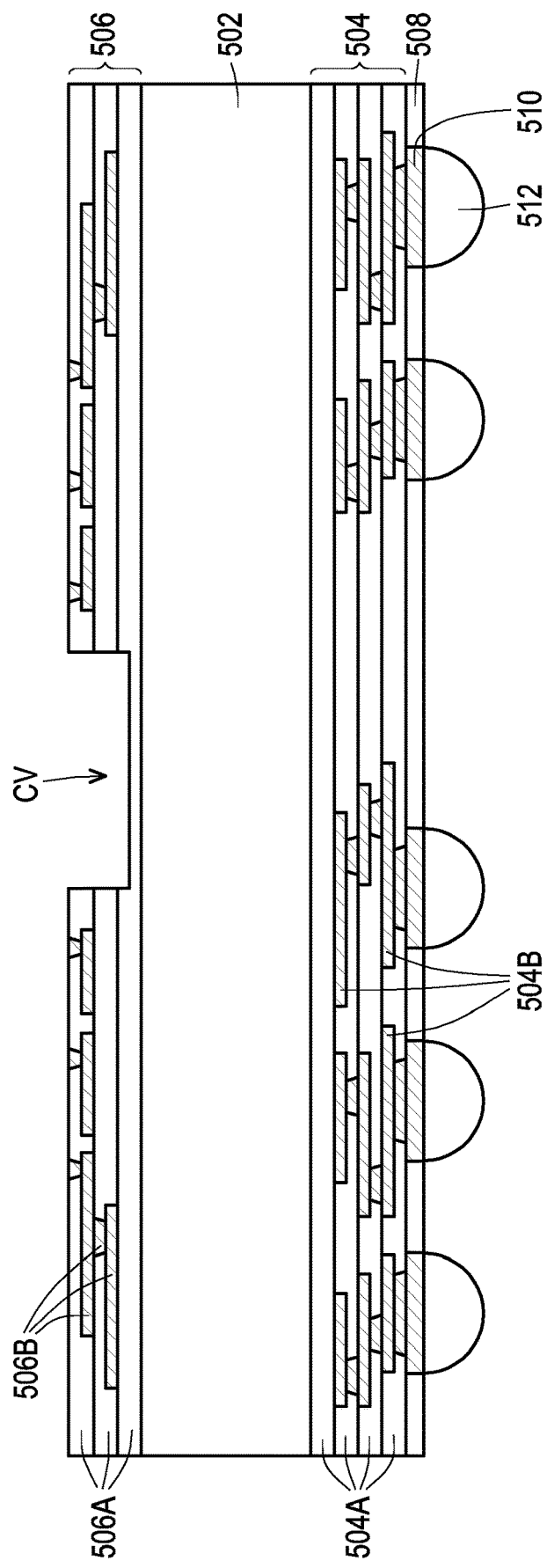
FIG. 10A to FIG. 10D are schematic sectional views of various stages in a method of fabricating a package structure in accordance with some other embodiments of the present disclosure.

FIG. 10A to FIG. 10D are schematic sectional views of various stages in a method of fabricating a package structure in accordance with some other embodiments of the present disclosure. Referring to FIG. 10A, a core substrate 502 is provided. The core substrate 502 may be a silicon substrate, or other suitable substrate for carrying the components located thereon. In some embodiments, a first redistribution layer 504 and a second redistribution layer 506 are respectively disposed on two opposing surfaces of the core substrate 502. The first redistribution layer 504 includes a plurality of dielectric layers 504A and a plurality of conductive elements 504B alternately stacked. Similarly, the second redistribution layer 506 includes a plurality of dielectric layers 506A and a plurality of conductive elements 506B alternately stacked. In the exemplary embodiment, the number of layers of the dielectric layers 504A, 506A and the conductive elements 504B, 506B may be adjusted based on product requirement.

In some embodiments, a plurality of conductive pads 510 may be disposed on an exposed top surface of the topmost layer of the conductive elements 504B of the first redistribution layer 504. Furthermore, a passivation layer 508 may be surrounding the conductive pads 510. In some embodiments, conductive terminals 512 are further disposed on the conductive pads 510. The conductive terminals 512 are, for example, solder balls or ball grid array (BGA) balls. In some embodiments, a portion of the second redistribution layer 506 may be removed to form a cavity CV. The cavity CV corresponds to a space used for accommodating an optical connector element. In other words, the dimensions of the cavity CV may be adjusted depending on the size of the optical connector element.

Figure 10B:
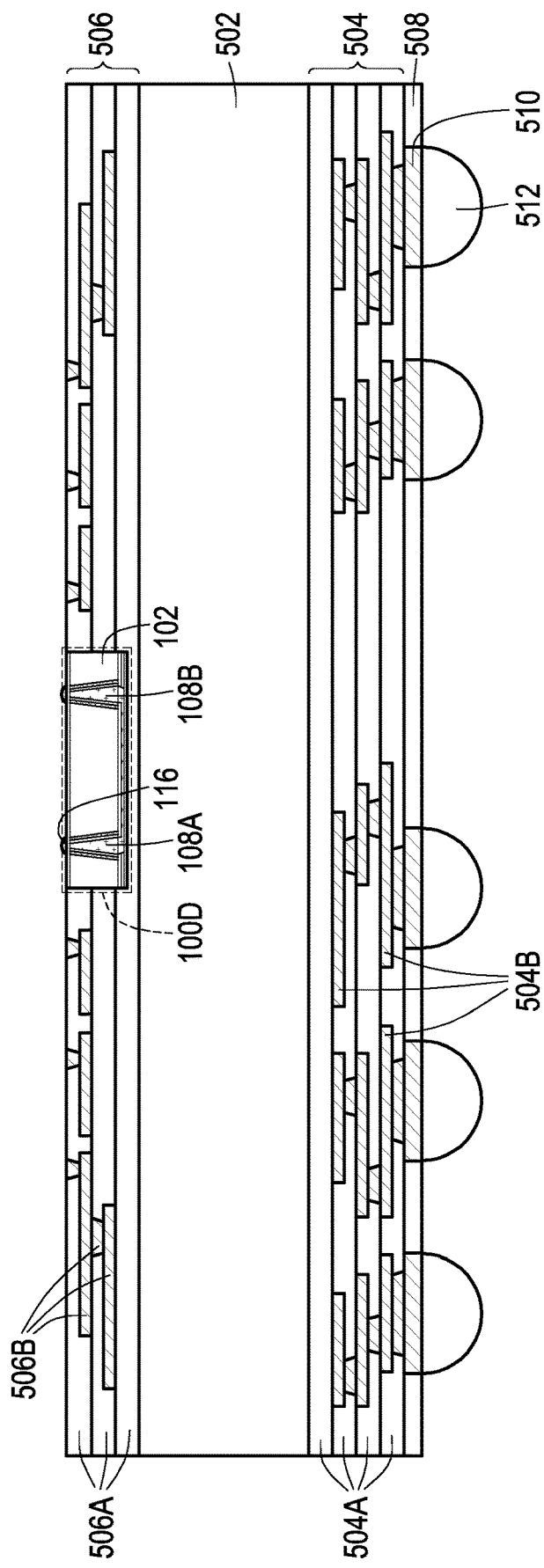

Referring to FIG. 10B, in a subsequent step, the optical connector element 100D described in FIG. 4 may be placed into the cavity CV, so that the optical connector element 100D is surrounded by the second redistribution layer 506. In some embodiments, the optical connector element 100D includes a first polymer via 108A and a second polymer via 108B connected together by a polymer connecting structure 109 (see FIG. 4). Furthermore, optical lens 116 are disposed over the first polymer via 108A and the second polymer via 108B respectively.

Figure 10C:
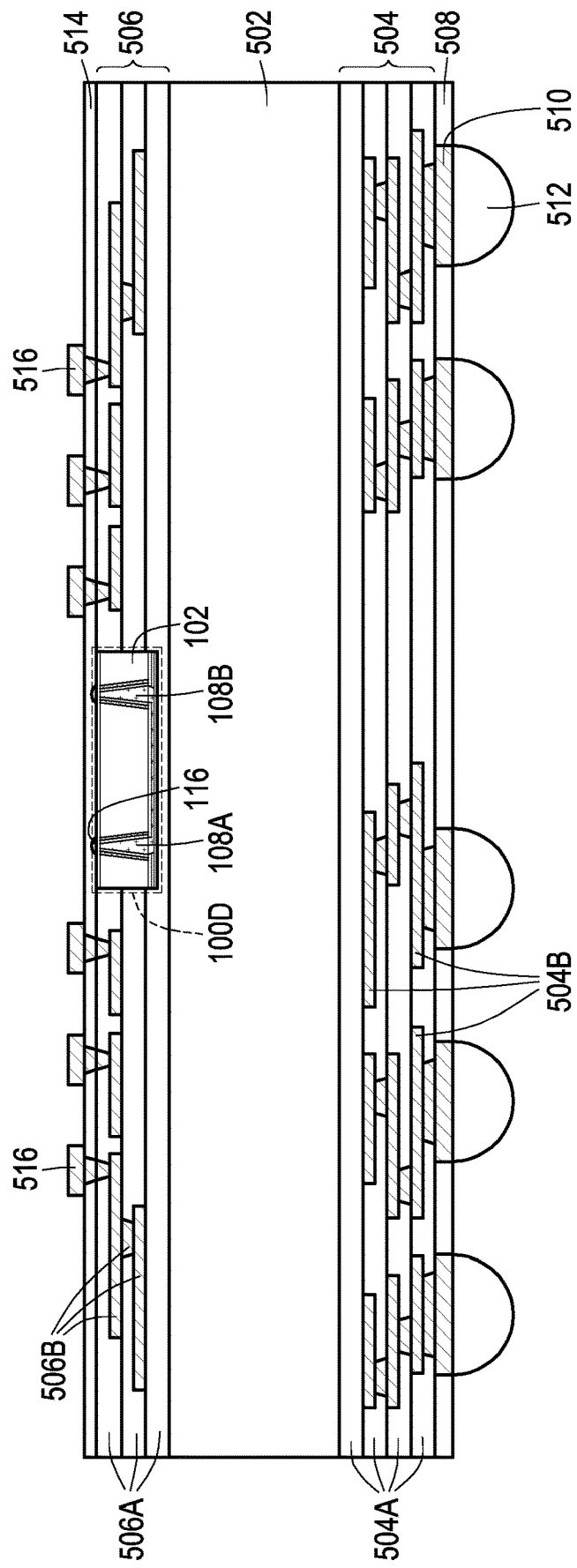

Referring to FIG. 10C, a polymer layer 514 and conductive connectors 516 may be disposed over the second redistribution layer 506. For example, the conductive connectors 516 are electrically connected to the conductive elements 506B of the second redistribution layer 506. The polymer layer 514 may be a photosensitive material such as polybenzoxazole (PBO), polyimide (PI), or the like. The polymer layer 514 may cover the optical lens 116 of the optical connector element 100D.

Figure 10D:
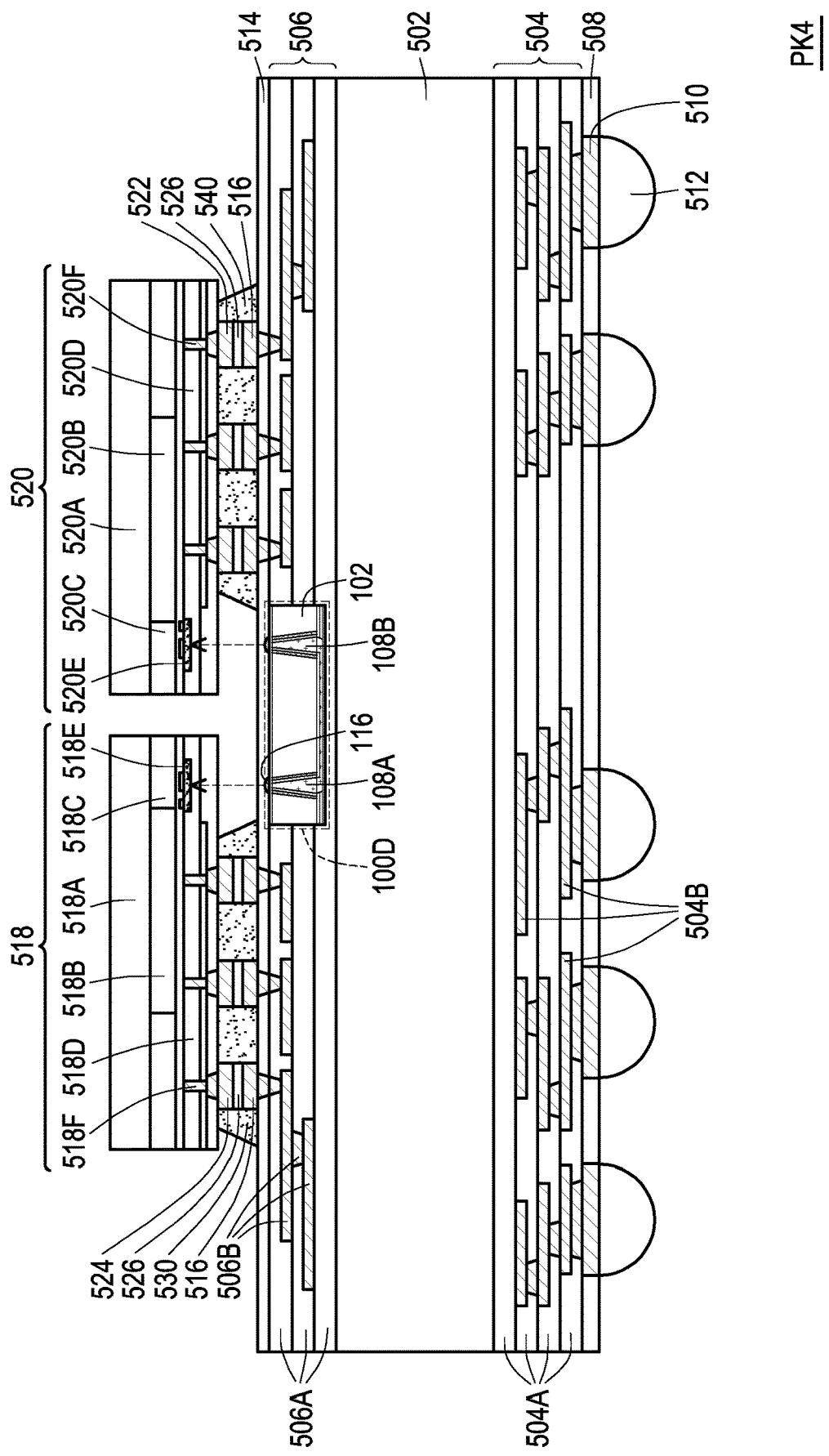

Referring to FIG. 10D, a first system on integrated circuit (SoIC) die 518 and a second SoIC 520 are provided and mounted on the second redistribution layer 506. For example, the first SoIC die 518 and the second SoIC die 520 are electrically connected to the second redistribution layer 506 through the conductive connectors 506. In some embodiments, the first SoIC die 518 and the second SoIC die 520 are optically communicated with each other through the optical connector element 100D embedded in the second redistribution layer 506. In some other embodiments, the first SoIC die 518 and the second SoIC die 520 are optically communicated between the optical connector element 100D and optical fibers (not shown).

As illustrated in FIG. 10D, the first SoIC die 518 may include a support substrate 518A, an electronic die 518B, an insulating encapsulant 518C, a photonic die 518D, an optical coupler 518E and conductive vias 518F. For example, the electronic die 518B is disposed on the support substrate 518A, while the insulating encapsulant 518C is surrounding the electronic die 518B. The photonic die 518D is stacked on the electronic die 518B, and includes the optical coupler 518E and the conductive vias 518F embedded therein. The first SoIC die 518 is electrically connected to the conductive connectors 516 and the second redistribution layer 506 through the conductive elements 524 and conductive bumps 526. For example, the conductive bumps 526 are disposed in between the conductive connectors 516 and the conductive elements 524. Furthermore, the conductive elements 524 are electrically connected to the conductive vias 518F of the first SoIC die 518. In some embodiments, the first SoIC die 518 is arranged on the second redistribution layer 506 so that the optical coupler 518E is vertically aligned with the first polymer vias 108A of the optical connector element 100D. Furthermore, a first underfill 530 is formed between the first SoIC die 518 and the second redistribution layer 506 to cover and surround the conductive connectors 516, the conductive elements 524 and the conductive bumps 526. Accordingly, the reliability of electrical connection between the first SoIC die 518 and the second redistribution layer 506 may be enhanced by the first underfill 530.

In a similar way, the second SoIC die 520 may include a support substrate 520A, an electronic die 520B, an insulating encapsulant 520C, a photonic die 520D, an optical coupler 520E and conductive vias 520F. For example, the electronic die 520B is disposed on the support substrate 520A, while the insulating encapsulant 520C is surrounding the electronic die 520B. The photonic die 520D is stacked on the electronic die 520B, and includes the optical coupler 520E and the conductive vias 520F embedded therein. The second SoIC die 520 is electrically connected to the conductive connectors 516 and the second redistribution layer 506 through the conductive elements 522 and conductive bumps 526. For example, the conductive bumps 526 are disposed in between the conductive connectors 516 and the conductive elements 522. Furthermore, the conductive elements 522 are electrically connected to the conductive vias 520F of the second SoIC die 520. In some embodiments, the second SoIC die 520 is arranged on the second redistribution layer 506 so that the optical coupler 520E is vertically aligned with the second polymer vias 108B of the optical connector element 100D. Furthermore, a second underfill 540 is formed between the second SoIC die 520 and the second redistribution layer 506 to cover and surround the conductive connectors 516, the conductive elements 522 and the conductive bumps 526. Accordingly, the reliability of electrical connection between the second SoIC die 520 and the second redistribution layer 506 may be enhanced by the second underfill 540. Up to here, a package structure PK4 (or semiconductor device) in accordance with some embodiments of the present disclosure is accomplished.

Figure 11:
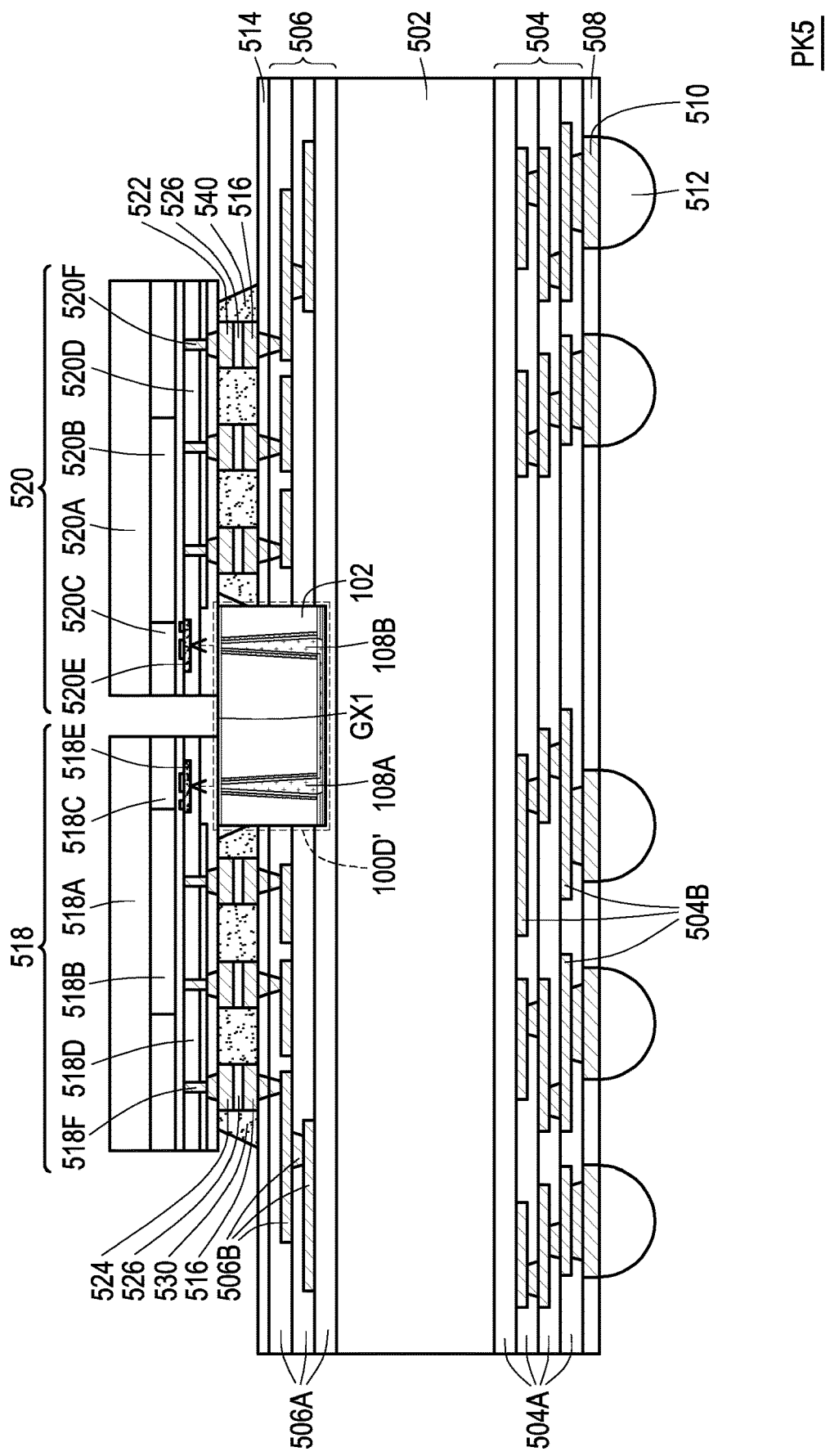
FIG. 11 is a schematic sectional view of a package structure in accordance with some other embodiments of the present disclosure.

FIG. 11 is a schematic sectional view of a package structure in accordance with some other embodiments of the present disclosure. The package structure PK5 (or semiconductor device) illustrated in FIG. 11 is similar to the package structure PK4 illustrated in FIG. 10D. Therefore, the same reference numerals are used to refer to the same or like parts, and its detailed description will not be repeated herein. The difference between the embodiments is that the optical connector element 100D shown in FIG. 10D is replaced with a modified optical connector element 100D' shown in FIG. 11.

In the exemplary embodiment, the modified optical connector element 100D' is the same as the optical connector element 100D (see FIG. 4), except that the gradient layer 114 and the optical lens 116 are omitted. As illustrated in FIG. 11, the modified optical connector element 100D' is attached to the first SoIC die 518 and the second SoIC die 520 by an optical glue GX1 or adhesive. The modified optical connector element 100D' includes the first polymer via 108A vertically aligned with the optical coupler 518E of the first SoIC die 518, and includes the second polymer via 108B vertically aligned with the optical coupler 520E of the second SoIC die 520. As such, the first SoIC die 518 and the second SoIC die 520 are optically communicated with each other through the modified optical connector element 100D' embedded in the second redistribution layer 506.

In the above-mentioned embodiments, the semiconductor device or package structure includes at least one optical connector element having optical vias for transmitting optical data/optical signals across different regions of the package/device. The flexible design allows various alone devices such as integrated passive devices (IPDs), local silicon interconnect (LSI) dies and photonic dies to be integrated together in the same package, while using the optical connector element to fan-out or transmit optical signals to the desired regions. Accordingly, the package structure may have miniaturized package size while data transmission rate is enhanced.

In accordance with some embodiments of the present disclosure, a semiconductor device includes an optical connector element and an optical coupler. The optical connector element includes a base structure, a first polymer via and a cladding layer. The base structure has a first surface and a second surface opposite to the first surface. The first polymer via passes through the base structure from the first surface to the second surface. The cladding layer is surrounding the first polymer via, wherein a refractive index of the cladding layer is different than a refractive index of the first polymer via. The optical coupler is disposed over the optical connector element, wherein the optical coupler receives optical signals from the first polymer via.

In accordance with some other embodiments of the present disclosure, a package structure includes a photonic die, an optical connector element and a redistribution layer. The photonic die includes conductive posts, an optical coupler, and a polymer layer covering the conductive posts and the optical coupler. The optical connector element is disposed over the photonic die, wherein the optical connector element includes an optical via, a polymeric cladding layer and a base structure. The optical via is arranged in alignment with the optical coupler. The polymeric cladding layer is covering sidewalls of the optical via. The base structure is surrounding the optical via and the polymeric cladding layer. The redistribution layer is electrically connected to the conductive posts of the photonic die.

In accordance with yet another embodiment of the present disclosure, a method of fabricating a semiconductor device is described. The method includes the following steps. An optical connector element is formed by: providing a base structure; etching the base structure to form an opening; forming a cladding layer in the opening; forming a first polymer via in the opening, wherein the first polymer via is surrounded by the cladding layer, and a refractive index of the cladding layer is different than a refractive index of the first polymer via; performing a planarization process on a first surface of the base structure to reveal a first end of the first polymer via; and reducing a thickness of the base structure from a second surface of the base structure to reveal a second end of the first polymer via, wherein the first surface is opposite to the second surface. The optical connector element is disposed over an optical coupler, wherein the optical coupler receives optical signals from the first polymer via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an optical connector element, comprising:
      a base structure having a first surface and a second surface opposite to the first surface;
      a first polymer via passing through the base structure from the first surface to the second surface;
      a cladding layer surrounding the first polymer via, wherein a refractive index of the cladding layer is different than a refractive index of the first polymer via;
      an oxide layer surrounding the cladding layer and the first polymer via, wherein the oxide layer extends from the first surface to the second surface; and
   an optical coupler disposed over the optical connector element, wherein the optical coupler receives optical signals from the first polymer via.

2. The semiconductor device according to claim 1, wherein the cladding layer is a polymeric cladding layer extending along sidewalls of the first polymer via from the first surface to the second surface.

3. The semiconductor device according to claim 1, further comprising:
   a second polymer via passing through the base structure from the first surface to the second surface; and
   a second cladding layer surrounding the second polymer via, wherein a refractive index of the second cladding layer is different than a refractive index of the second polymer via.

4. The semiconductor device according to claim 3, further comprising:
   a polymer connecting structure disposed over the first surface of the base structure and connecting the first polymer via to the second polymer via; and
   optical lens disposed on the first polymer via and the second polymer via over the second surface of the base structure.

5. The semiconductor device according to claim 1, wherein the first polymer via comprises a first end and a second end opposite to the second end, and the second end is facing the optical coupler, and an optical lens or an optical fiber is attached to the first end of the first polymer via.

6. The semiconductor device according to claim 1, wherein the first polymer via comprises a first end and a second end opposite to the second end, and the second end is facing the optical coupler, and a prism structure is attached to the first end of the first polymer via.

7. The semiconductor device according to claim 1, further comprising:
   an electronic die disposed aside the optical connector element; and
   an insulating encapsulant, encapsulating the electronic die and the optical connector element.

8. A package structure, comprising:
   a photonic die comprising conductive posts, an optical coupler, and a polymer layer covering the conductive posts and the optical coupler;
   an optical connector element disposed over the photonic die, wherein the optical connector element comprises:
      an optical via arranged in alignment with the optical coupler;
      a polymeric cladding layer covering sidewalls of the optical via; and
      a base structure surrounding the optical via and the polymeric cladding layer;
   a redistribution layer, electrically connected to the conductive posts of the photonic die.

9. The package structure according to claim 8, wherein the optical connector element is attached to the photonic die by an optical gel.

10. The package structure according to claim 8, further comprising an insulating encapsulant encapsulating the optical connector element.

11. The package structure according to claim 10, further comprising a semiconductor die embedded in the insulating encapsulant and electrically connected to the redistribution layer.

12. The package structure according to claim 10, further comprising a second insulating encapsulant encapsulating the photonic die, wherein the first insulating encapsulant and the second insulating encapsulant are disposed on opposing sides of the redistribution layer.

13. The package structure according to claim 8, further comprising an oxide layer embedded in the base structure and surrounding the polymeric cladding layer and the optical via.

14. The package structure according to claim 8, further comprising an optical lens or an optical fiber attached on the optical via of the optical connector element.

15. The package structure according to claim 8, wherein the optical via and the polymeric cladding layer are made of materials having different refractive index.

16. A method of fabricating a semiconductor device, comprising:
  forming an optical connector element, comprising:
    providing a base structure;
    etching the base structure to form an opening;
    forming an oxide layer in the opening;
    forming a cladding layer in the opening;
    forming a first polymer via in the opening, wherein the first polymer via is surrounded by the cladding layer, and a refractive index of the cladding layer is different than a refractive index of the first polymer via, and the oxide layer surrounds the cladding layer and the first polymer via;
    performing a planarization process on a first surface of the base structure to reveal a first end of the first polymer via;
    reducing a thickness of the base structure from a second surface of the base structure to reveal a second end of the first polymer via, wherein the first polymer via passes through the base structure from the first surface to the second surface, and the oxide layer extends from the first surface to the second surface, wherein the first surface is opposite to the second surface;
  disposing the optical connector element over an optical coupler, wherein the optical coupler receives optical signals from the first polymer via.

17. The method according to claim 16,
  wherein the planarization process removes a first portion of the oxide layer, and reducing the thickness of the base structure from the second surface further removes a second portion of the oxide layer.

18. The method according to claim 16, further comprising:
  etching the base structure to form a second opening;
  forming a second cladding layer in the second opening;
  forming a second polymer via in the opening, wherein the second polymer via is surrounded by the second cladding layer, and a refractive index of the second cladding layer is different than a refractive index of the second polymer via;
  performing the planarization process to reveal the first end of the first polymer via and a first end of the second polymer via; and
  reducing the thickness of the second surface of the base structure to reveal the second end of the first polymer via and a second end of the second polymer via.

19. The method according to claim 18, further comprising:
  forming a polymer connecting structure over the first surface of the base structure for connecting the first polymer via to the second polymer via; and
  providing optical lens on the first polymer via and the second polymer via over the second surface of the base structure.

20. The method according to claim 16, further comprising:
  providing an optical fiber or an optical lens to the first end of the first polymer via, and wherein the second end is facing the optical coupler.

\* \* \* \* \*